(12) United States Patent
Bleeker et al.

(10) Patent No.: US 7,460,208 B2
(45) Date of Patent: Dec. 2, 2008

(54) LITHOGRAPHIC APPARATUS AND DEVICE MANUFACTURING METHOD

(75) Inventors: Arno Jan Bleeker, Westerhoven (NL); Dominicus Jacobus Petrus Adrianus Franken, Veldhoven (NL); Martinus Hendricus Hendricus Hoeks, Breugel (NL); Lambertus Gerardus Maria Kessels, Aalst-Waalre (NL); Tobrjörn Sandström, Pixbo (SE)

(73) Assignee: ASML Netherlands B.V., Veldhoven (NL)

( * ) Notice: Subject to any disclaimer, the term of this patent is extended or adjusted under 35 U.S.C. 154(b) by 255 days.

(21) Appl. No.: 11/061,754

(22) Filed: Feb. 18, 2005

(65) Prior Publication Data

US 2006/0187428 A1 Aug. 24, 2006

(51) Int. Cl.
*G03B 27/52* (2006.01)
*G02B 26/00* (2006.01)

(52) U.S. Cl. ......................................... 355/53; 359/290
(58) Field of Classification Search .................. 355/55, 355/53, 67, 71; 345/697; 359/619, 290; 438/7
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2004/0041104 A1 | 3/2004 | Liebregts et al. | |
| 2004/0130561 A1 | 7/2004 | Jain | |
| 2005/0007572 A1 | 1/2005 | George et al. | |
| 2005/0074906 A1* | 4/2005 | Kochersperger | 438/7 |

FOREIGN PATENT DOCUMENTS

WO  WO 98/33096  7/1998
WO  WO 98/38597  9/1998

* cited by examiner

*Primary Examiner*—Peter B Kim
(74) *Attorney, Agent, or Firm*—Sterne, Kessler, Goldstein & Fox P.L.L.C (57) ABSTRACT

A lithographic apparatus provided with an array of individually controllable elements that is detachably mounted to mounting points on a support frame of the lithographic apparatus.

38 Claims, 7 Drawing Sheets

LITHOGRAPHIC APPARATUS AND DEVICE MANUFACTURING METHOD

BACKGROUND

1. Field

The present invention relates to a lithographic apparatus and a method for manufacturing a device.

2. Related Art

A lithographic apparatus is a machine that applies a desired pattern onto a substrate, usually onto a target portion of the substrate. A lithographic apparatus can be used, for example, in the manufacture of flat panel displays, integrated circuits (ICs), and other devices involving fine structures. In a conventional apparatus, a patterning device, which can be referred to as a mask or a reticle, can be used to generate a circuit pattern corresponding to an individual layer of a flat panel display or other device. This pattern can be transferred onto a target portion (e.g., comprising part of one or several dies) on a substrate (e.g., a glass plate). Transfer of the pattern is typically via imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. An advantage of such a system compared to a mask-based system is that the pattern can be changed more quickly and for less cost.

The size of an array of individually controllable elements can be limited due to the difficultly in manufacturing a large array with adequate quality and the difficulty in providing sufficient control lines to a large array in order to set patterns on it. Thus, several such arrays of individually controllable elements can be used within a single lithographic apparatus to pattern the substrate. It is desirable that the arrays of individually controllable elements are aligned relative to the remainder of the apparatus and each other to within predetermined tolerances. In order to set the pattern on the arrays of individually controllable elements, each element is actuated and the requisite control signals are supplied to the arrays. Consequently, heat is generated in the arrays of individually controllable elements, which is not generated in a conventional mask or reticle. Such heat can result in thermal expansion within the lithographic apparatus, which can affect the alignment of the arrays of individually controllable elements relative to the lithographic apparatus and relative to each other.

Therefore, what is needed is a system and method for securing arrays of individually controllable elements to a lithographic apparatus that can ensure that a position of the arrays is within a required tolerances.

SUMMARY

According to one embodiment of the present invention, there is provided a lithographic apparatus comprising a support frame and at least one array of individually controllable elements. The support frame has at least one mounting point for receiving the array of individually controllable elements. The at least one array of individually controllable elements is used to modulate a beam of radiation and is detachably mounted to the mounting point on the support frame.

According to one embodiment of the present invention, there is provided a lithographic system comprising a lithographic apparatus including a support frame and one or more arrays of individually controllable elements. The support frame has one or more mounting points, each configured to receive an array of individually controllable elements. The one or more arrays of individually controllable elements are used to modulate a beam of radiation and are configured to be detachably mounted to the mounting points on the support frame.

According to one embodiment of the present invention, there is provided a device manufacturing method comprising the following steps. Projecting a modulated beam of radiation onto a substrate. Mounting one or more arrays of individually controllable elements to corresponding mounting points on a support frame that are configured to independently detachably receive one of the arrays of individually controllable elements. Modulating the beam of radiation using the at least one array of individually controllable elements.

According to one embodiment of the present invention, there is provided a method of preparing a lithographic apparatus comprising the following steps. Mounting one or more arrays of individually controllable elements to corresponding mounting points on a support frame of the lithographic apparatus. Configuring the one or more mounting points to independently detachably receive one of the arrays of individually controllable elements.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the one or more embodiments of the present invention and to enable a person skilled in the pertinent art to make and use the one or more embodiments of the present invention.

The present invention will now be described with reference to the accompanying drawings.

DETAILED DESCRIPTION

Overview and Terminology

The terms "contrast device," "patterning device," "patterning array," or "array of individually controllable elements" used herein should be broadly interpreted as referring to any device that can be used to modulate the cross-section of a radiation beam such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit. The terms "light valve" and "Spatial Light Modulator" (SLM) can also be used in this context. Examples of such patterning devices include:

A programmable mirror array. This can comprise a matrix-addressable surface having a viscoelastic (e.g., having viscous as well as elastic properties) control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (Micro Electro-Mechanical Systems) can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. Mirror arrays are described in, for example, U.S. Pat. Nos. 5,296,891 and 5,523,193, and PCT patent applications WO 98/38597 and WO 98/33096, which are incorporated herein by reference in their entireties.

A programmable LCD array is another example. Programmable LCD arrays are described in, for example, U.S. Pat. No. 5,229,872, which is incorporated herein by reference in its entirety.

The lithographic apparatus can comprise one or more patterning arrays. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements and a common projection system (or part of the projection system).

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. Any use of the term "projection lens" herein can be considered as synonymous with the more general term "projection system".

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements, such as a micro lens array (known as an MLA) or a Fresnel lens array, e.g. to form the secondary sources and to image spots onto the substrate. In such an arrangement, each of the focusing elements in the array of focusing elements can be associated with one of the individually controllable elements in the array of individually controllable elements. Alternatively, the projection system can be configured such that radiation from a plurality of the individually controllable elements in the array of individually controllable elements is directed to one of the focusing elements in the array of focusing elements and from there onto the substrate.

As herein depicted in the figures below, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (e.g., dual stage) or more (e.g., multiple stage) substrate tables. In such "multiple stage" machines the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g. water, so as to fill a space between the projection system and the substrate. An immersion liquid can also be applied to other spaces in the lithographic apparatus, for example, between the contrast device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

In another example, the invention can take the form of a computer program containing one or more sequences of machine-readable instructions describing a method as disclosed above, or a data storage medium (e.g. semiconductor memory, magnetic or optical disk) having such a computer program stored therein.

Exemplary Environment

Figure 1:
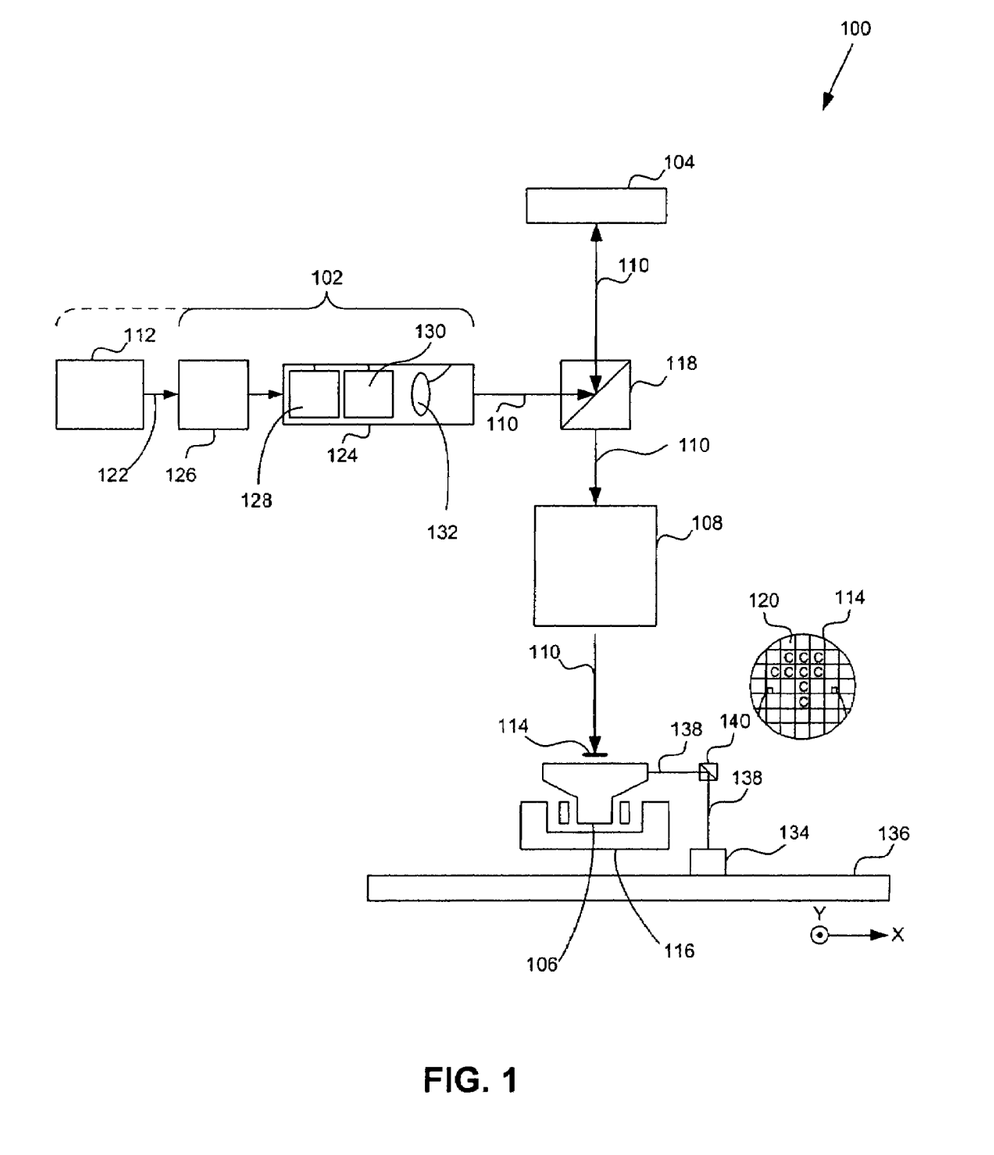
FIG. 1 depicts a lithographic apparatus, according to one embodiment of the invention.

FIG. 1 schematically depicts a lithographic projection apparatus 100 according to an embodiment of the invention. Apparatus 100 includes at least a radiation system 102, an array of individually controllable elements 104 (e.g., a contrast device or patterning device), an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., a frequency tripled Nd:YAG laser in pixel grid imaging mode or an excimer laser in other modes) can produce a beam of radiation 122. Beam 122 is fed into an illumination system (e.g., illuminator) 124, either directly or after having traversed conditioning device 126, such as a beam expander, for example.

In one example, when apparatus 100 is operating in a pixel grid imaging mode, illuminator 124 can comprise an adjusting device 128 for setting a zoom to adjust a spot size of beam 122. In addition, illuminator 124 will generally include various other components, such as spot generator 130 and a condenser 132. For example, spot generator 130 can be, but is not limited to, a refractive or diffractive grating, segmented mirrors arrays, waveguides, or the like. In this way, beam 110 impinging on the array of individually controllable elements 104 has a desired zoom, spot size, uniformity, and intensity distribution in its cross section.

In another example, when apparatus 100 is operating in other modes, illumination 124 can comprise an adjusting device 128 for setting the outer and/or inner radial extent (commonly referred to as σ-outer and σ-inner, respectively) of the intensity distribution in beam 122. In addition, illuminator 124 will generally include various other components. In this example, element 130 could be an integrator 130 and element 132 could be a condenser 132, compared to the example discussed above. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100. In alternative embodiments, source 112 can be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved, so as to position different target portions 120 in the path of beam 110. Where used, the positioning device (not shown) for the array of individually controllable elements 104 can be used to correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in a plurality of modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: similar to step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: similar to pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially the same shape. On substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Figure 2:
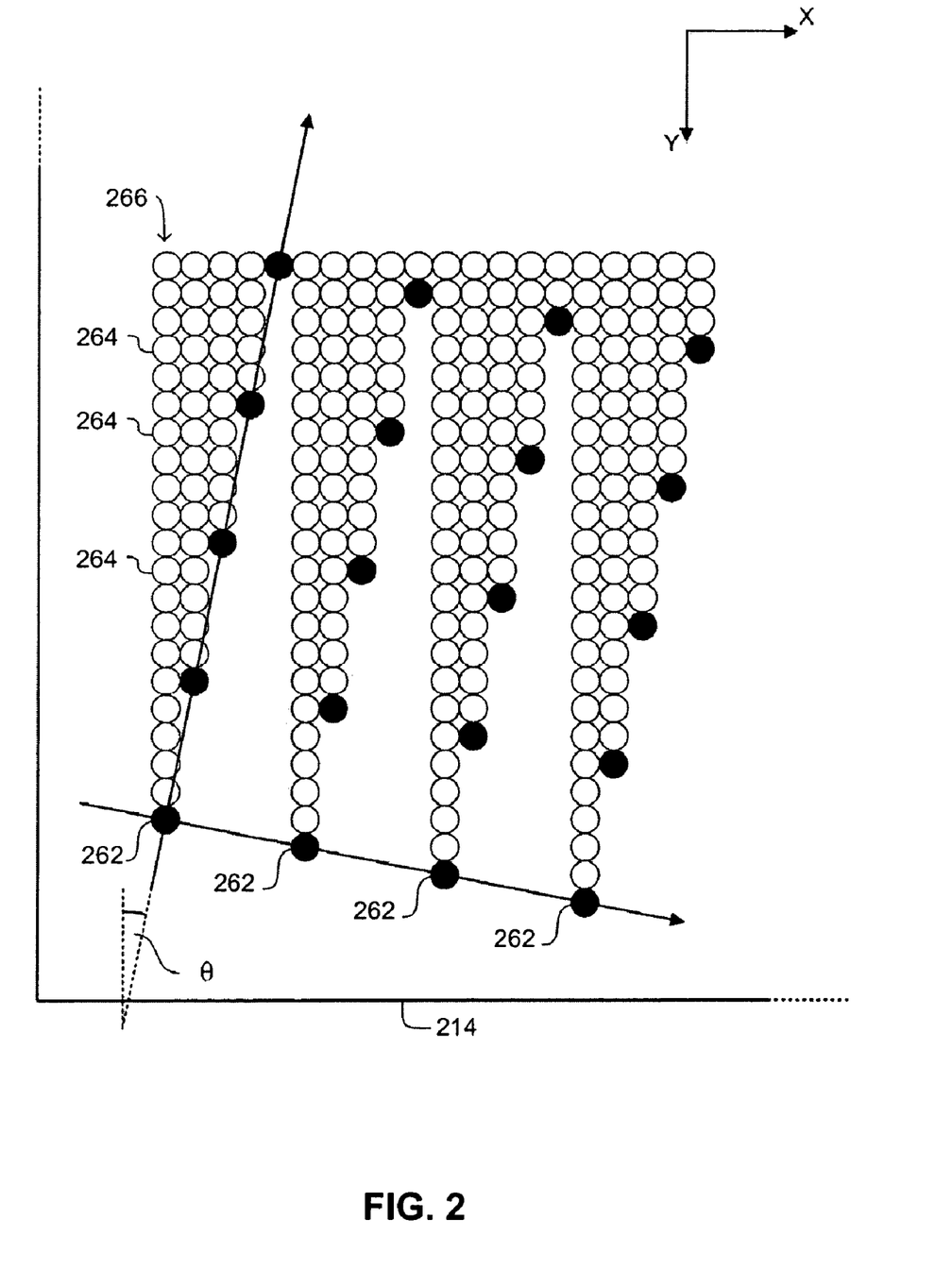
FIG. 2 depicts a mode of transferring a pattern to a substrate using a lithographic apparatus, according to one embodiment of the present invention.

FIG. 2 illustrates schematically how a pattern on a substrate 214 is generated, according to one embodiment of the present invention. For example, this embodiment can be performed using pixel grid imaging.

The darkened circles 262 represent spots recently projected onto substrate 214 by a MLA in a projection system, for example the projection system as shown in FIG. 2. Substrate 214 is moved relative to the projection system in a Y direction as a series of exposures are exposed on substrate 214.

The open circles 264 represent spots that have previously been exposed on substrate 214. As shown, each spot 262 projected onto substrate 214 using the array of lenses within the projection system exposes a row 266 of spot exposures 262/264 on substrate 214. The complete pattern for substrate 214 is generated by the sum of all the rows 266 of spot exposures 264 exposed by each of the spots 262. Such an arrangement is commonly referred to as "pixel grid imaging," which was discussed above.

It can be seen that the array of radiation spots 262 is arranged at an angle θ relative to substrate 214 (i.e., when the edges of the substrate 214 lie parallel to the X and Y directions). This is done so that when substrate 214 is moved in a scanning direction (e.g., the Y-direction), each radiation spot 262 will pass over a different area of substrate 214, thereby allowing the entire substrate to be covered by the array of radiation spots. It will be appreciated that for ease of illustration the angle θ is exaggerated in FIG. 2.

Figure 3:
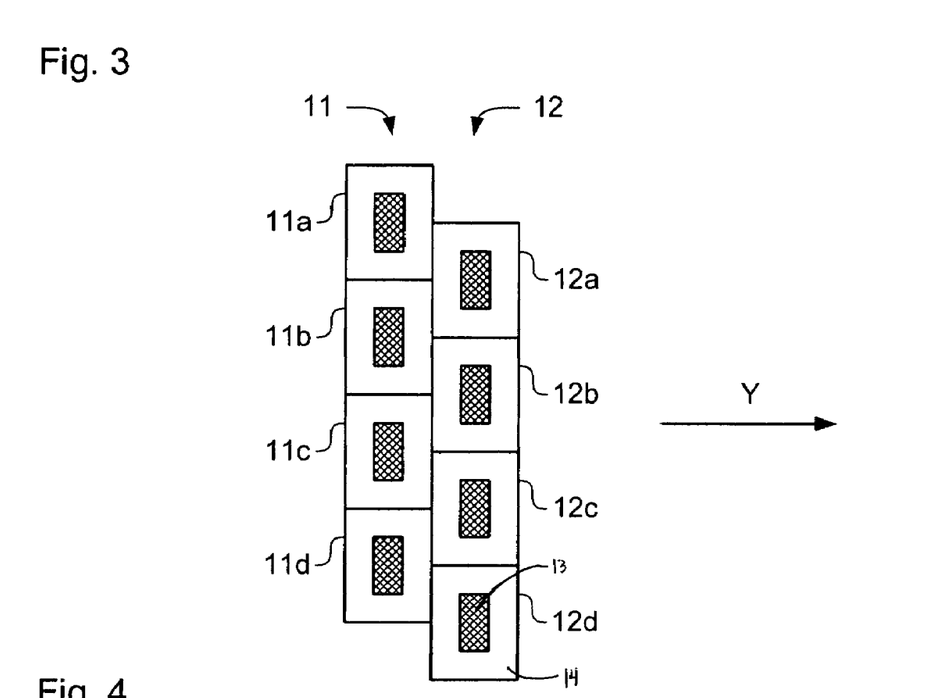
FIGS. 3 and 4 depict mounting layouts for arrays of individually controllable elements, according to various embodiments of the present invention.
Figure 4:
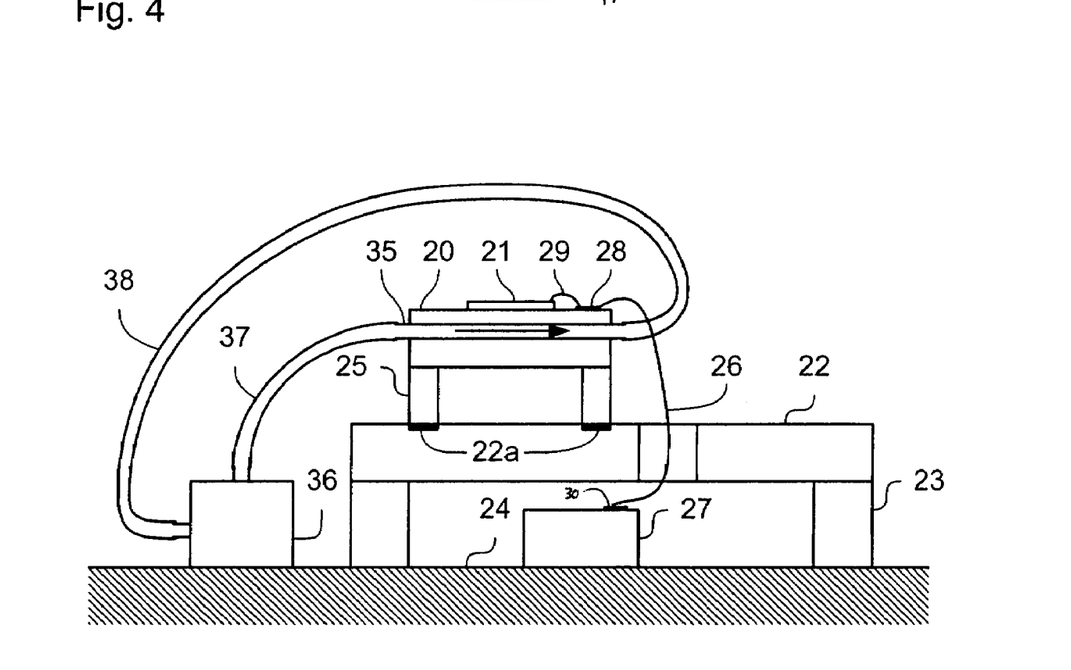

FIGS. 3 and 4 depict mounting layouts for arrays of individually controllable elements, according to various embodiments of the present invention.

As discussed above, one or more arrays of individually controllable elements can be used to modulate the beam of radiation that is projected onto the substrate.

In one example shown in FIG. 3, an arrangement is shown that can be used where a plurality of arrays of individually controllable elements are to be used to modulate the radiation beam. As shown, a first row 11 of arrays of individually controllable elements 11a, 11b, 11c, 11d is arranged adjacent to a second row 12 of arrays of individually controllable elements 12, 12b, 12c, 12d. Each array of individually controllable elements has an active area 13 and a passive area 14 surrounding it. The active area 13 is the part of the array of individually controllable elements that can modulate the radiation beam, i.e., it includes the individually controllable elements. The passive area 14 surrounding the active area 13 includes the portion of the array of individually controllable elements that cannot modulate the beam of radiation. For example, it can include portions of the array of individually controllable elements providing auxiliary functions, such as information processing and input and providing support for the array of individually controllable elements.

As a result of the passive areas 14 surrounding the active areas 13, within each row 11, 12 of arrays of individually controllable elements, there are separations between the active areas 13 of adjacent arrays of individually controllable elements. Consequently, the portions of a radiation beam (not shown) modulated by each of the active areas 13 of the arrays of individually controllable elements within a row 11 or 12 are also separated from each other. For reasons that will be apparent below, the two rows 11, 12 are offset from each other in the direction along the rows.

During a sequence of exposures, a substrate (not shown) is arranged to move relative to the modulated beam of radiation in a direction perpendicular to the rows 11, 12 of arrays of individually controllable elements (namely direction Y as shown in FIG. 3). Accordingly, a portion of the substrate exposed by the portion of the modulated beam of radiation associated with the first row 11 of the arrays of individually controllable elements is subsequently aligned with the portion of the modulated beam of radiation modulated by the arrays of individually controllable elements within the second row 12. The offset of the arrays of individually controllable elements within the second row 12 relative to the first row 11 is such that the portions of the radiation beam modulated by the active areas 13 of the arrays of individually controllable elements in the second row expose the portions of the substrate between the portions of the substrate exposed by the portions of the modulated beam of radiation associated with the active areas 13 of the arrays of individually controllable elements within the first row 11. In this manner, each portion of the substrate can be exposed by a portion of the modulated beam of radiation.

With reference now to FIG. 4, this embodiment shows an array of individually controllable elements mounted to a lithographic apparatus. As shown, a support frame 22 is mounted to the base frame 24 of the lithographic apparatus using supports 23. In one example, the supports 23 are configured to minimize the transfer of vibrations from the base frame 24 to the support frame 22, for example the supports 23 can have relatively low stiffness. Examples of such low stiffness supports are leaf springs.

The support frame 22 is provided with mounting points 22a that are configured to receive the arrays of individually controllable elements. In one example, each mounting point 22a is constructed to receive a single array of individually controllable elements in a manner that is independent of any of the other arrays of individually controllable elements. The array of individually controllable elements that is mounted to the mounting point 22a on the support frame 22 is formed of a support plate 20 that supports the active element 21 of the array of individually controllable elements. The support plate 20 can be manufactured from a material that has a small coefficient of thermal expansion such as INVAR (™) (a cobalt containing steel), ZERODUR (™) (manufactured by Schott Glass, Hattenbergerstraβe 10 55120, Mainz, Germany, ULE (™) glass (manufactured by Coming Incorporated, 1 River Front Plaza, Corning, N.Y. 14831), or some combination of these. Alternatively or additionally, the support plate 20 can be made from a material that conducts heat well and is therefore easy to cool, such as aluminum.

In one example, each array of individually controllable elements is detachably mounted to support frame 22 of the lithographic apparatus. Accordingly, it is possible to remove one or more of the arrays of individually controllable elements. This can be desirable because, for example, the life of an array of individually controllable elements can be significantly shorter than the life of the lithographic apparatus as a whole. In an array of individually controllable elements comprising a plurality of rotatable mirrors, for example, the life of the array of individually controllable elements will be determined by the mechanical stress on the hinges of each of the rotatable mirrors. This stress can eventually result in the hinges breaking after a given amount of use or the stiffness of the hinges changing with the effect that a different force is required to actuate a mirror to a given extent.

In another example, it is possible to at least temporarily replace one of the arrays of individually controllable elements with another array of individually controllable elements. The removed array of individually controllable elements can then be inspected without interfering with the operation of the lithographic apparatus as a whole because it can continue operation using the replacement array of individually controllable elements. Such inspection can be useful for identifying if there are any faults in the array of individually controllable elements and, where appropriate, taking any necessary remedial action. Likewise the inspection can be used to calibrate the array of individually controllable elements, for example to take account of changes in the stiffness of the hinges of an array of rotatable mirrors during its lifetime. A lithographic apparatus can therefore be provided with two sets of arrays of individually controllable elements: while a first set is being used in the operation of the lithographic apparatus, the second set is being inspected, calibrated, repaired or replaced.

It will be appreciated that, in a lithographic apparatus employing a plurality of arrays of individually controllable elements, each array of individually controllable elements can be specially adapted to mount to a given mounting point on the support frame. Alternatively, the arrays of individually controllable elements can be configured such that each array of individually controllable elements can be mounted to any of the mounting points on the support frame. It should also be appreciated that a compromise between these two examples can be used. For example, the arrays of individually controllable elements can be adapted to be mounted to any of the mounting points 22a in a given row of arrays of individually controllable elements and/or some of the arrays of individually controllable elements can be configured to be used at the ends of a row of arrays of individually controllable elements whilst others are adapted to be used in the middle of a row.

In one example, the support plate 20 can be provided with a cooling element in order to dissipate heat generated by the array of individually controllable elements in use. For example, the support plate 20 can be provided with: (a) a peltier-effect element to assist the transfer of heat from the support plate 20 to the ambient environment; (b) a gas cooling system that directs a flow of cooling gas across at least a portion of planar plate; (c) one or more fluid conduits 35 passing through the support plate 20 through, through which a cooling fluid can be provided (as described in more detail below); or (d) a combination of these.

The support plate 20 is mounted to the support frame 22 through use of supports 25. The supports 25 can, for example, be attached to the support frame 22 by means of a mechanical connection that is detachable, such as securing the supports to the support frame 22 using one or more bolts. As an alternative, the supports 25 can be bonded to the support frame 22, for example using an adhesive (which can be chemically removed when the array of individually controllable elements needs to be removed). The mounting points 22a on the support frame 22 can include position stops that the supports 25 can be pushed against to ensure the correct positioning of the supports 25 on the mounting point on the support frame 22.

In one example, a controller 27 can be used to control the array of individually controllable elements. Controller 27 can be provided on the base frame 24. A flexible control cable 26 is provided to connect the controller 27 to the array of individually controllable elements. It will be appreciated that the controller 27 can be mounted elsewhere in the lithographic apparatus, for example on the support frame 22.

In one example, regardless of the components to which the controller 27 is mounted, it should further be appreciated that the data rate from the controller 27 to the array of individually controllable elements is very high. Accordingly, it is necessary to ensure that the control cable 26 is as short as possible to minimize the losses in the control cable 26. Accordingly, the controller 27 is located as close as possible to the array of individually controllable elements. For example, immediately adjacent to it.

In one example, the control cable 26 is flexible in order to minimize the transfer of vibrations from the controller 27, or any components to which it is mounted, to the array of individually controllable elements. In one example, at least one of a connection 30 between the controller 27 and the control cable 26 and the connection 28 between the control cable 26 and the array of individually controllable elements is detachable to enable changeover of the array of individually controllable elements. In another example, a fixed connection 29 can be provided between the connection 28 to the control cable 26 on the array of individually controllable elements and the active part 21 of the array of individually controllable elements.

As discussed above, the array of individually controllable elements can be provided with a fluid conduit 35 through which cooling fluid is provided. Accordingly, a fluid cooling unit 36 is also provided in order to cool the fluid and generate and/or control the flow of cooling fluid to the cooling conduit 35 in the array of individually controllable elements.

In one example, the cooling unit 36 can be mounted to the base frame 24 of the lithographic apparatus. In other examples, the cooling unit 36 can be mounted to the support frame 22, can be mounted to another component within the lithographic apparatus, or can be external to the lithographic apparatus. In any case, the cooling unit can be mounted by way of vibration isolators in order to minimize any transfer of vibrations from the cooling unit to any other part of the apparatus.

In one example, the cooling unit 36 is connected to the conduit 35 in the array of individually controllable elements by way of flexible fluid conduits 37, 38. The conduits 37, 38 are flexible in order to minimize any transfer of vibrations from the cooling unit 36 to the array of individually controllable elements. The connections between the conduits 37, 38 and at least one of the fluid conduit 35 in the array of individually controllable elements and the cooling unit 36 can be detachable to facilitate the removal of the array of individually controllable elements from its mounting point.

As discussed above, the lithographic apparatus can have a plurality of arrays of individually controllable elements. It will be appreciated that in this case, a plurality of arrays can be mounted to a single support frame 22. Similarly, the controller 27 can provide the control signals to a plurality of arrays of individually controllable elements, for example by way of a plurality of control cables 26. Alternatively, a plurality of controllers 27 can be provided, such that each controls a single array of individually controllable elements. Still further, each array of individually controllable elements can be provided with separate controllers 27 or they can be provided with a common cooling element 36 or share at least part of a common cooling element. For example, each array of individually controllable elements can have a separate cooling conduit (e.g., similar to 37,38) within its support plate 22, but the arrays of individually controllable elements can share a single fluid cooling unit 36 for cooling the cooling fluid.

In one example, the support frame 22 to which the arrays of individually controllable elements are mounted can be a part of a base frame of the lithographic apparatus, can be a frame that is used as a reference for measuring the position of other components in the lithographic apparatus, or can be part of the projection system.

In one example, when a distinct support frame is provided for the arrays of individually controllable elements, it can be mounted to any of the components discussed above. Furthermore, additional components within the lithographic apparatus can be mounted to the support frame 22 to which the arrays of individually controllable elements are mounted. Such additional components can, for example, include part or all of the illumination system, part or all of the projection system, and part or all of the substrate table.

In one example, each array of individually controllable elements can also be provided with an actuator system (not shown). The actuator system can be used to fine tune the position of the array of individually controllable elements once it has been mounted to the lithographic apparatus. Alternatively or additionally, the actuator system can be used to adjust the position of the array of individually controllable elements during use of the lithographic apparatus. For example, during use of the lithographic apparatus, the support frame 22 can increase in temperature. This can result in thermal expansion of the support frame 22, altering the distance between the mounting points 22a on the support frame 22. In turn, this can affect the position of an array of individually controllable elements relative to other arrays of individually controllable elements and/or relative to other components within the lithographic apparatus. The actuator system can be used to compensate for such thermal expansion.

In one example, in a lithographic apparatus the telecentricity of the image projected on the substrate should be maintained within a given limit, for example 10 mrad. However, in a lithographic apparatus using arrays of individually controllable elements, the magnification of the projection system can be relatively large (e.g., 250-1,000). Consequently, the telecentricity requirement of the array of individually controllable elements is very strict, for example 40 μrad to 160 μrad for the magnifications given above. In this case, the actuator system can be used to ensure that the orientation of the array of individually controllable elements is within the telecentricity requirements.

In one example, the actuator system can adjust the orientation of the array of individually controllable elements in order to compensate for telecentricity errors within an illuminator or a projection system. Measurements of the telecentricity errors introduced by the illumination system and/or the projection system can be made periodically, for example in calibration tests. The actuator system can be provided with a control system that determines the adjustments of the position of the array of individually controllable elements to compensate for the telecentricity errors measured during calibration. Alternatively, measurements of the overall telecentricity error can be made in real-time during use of the lithographic apparatus, for example using an auxiliary beam of radiation. In this case, the control system for the actuator system determines the required correction during the exposure process.

In one example, because telecentricity errors in the illumination system and projection system can be compensated, the telecentricity requirements for the illumination system and projection system can be relaxed, reducing their cost. This is beneficial in examples where the arrays of individually controllable elements cover a relatively small part of the optical field. Accordingly, it is significantly easier to compensate for the telecentricity using the arrays of individually controllable elements than requiring high telecentricity accuracy over the full optical field.

In one example, the actuator system can be configured such that it not only controls the position of the array of individually controllable elements, but also functions as the support for mounting the array of individually controllable elements to the support frame.

In one example, the actuator system is able to control the position of the array of individually controllable elements in six degrees of freedom, namely in linear directions along three orthogonal axes and rotationally about each of those axes.

Figure 5:
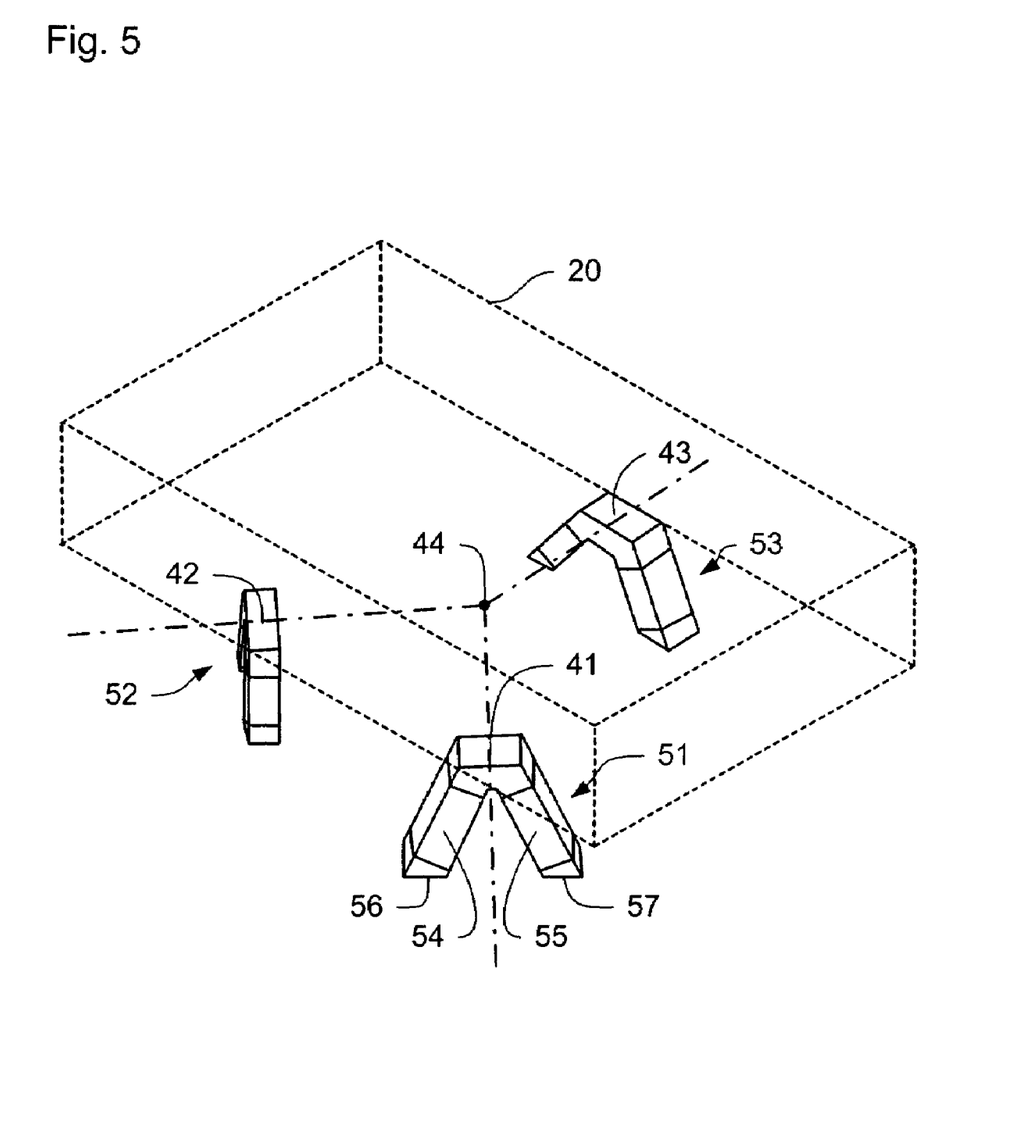
FIG. 5 depicts an actuator system for use with an array of individually controllable elements, according to one embodiment of the present invention.

FIG. 5 depicts an actuator system for use with an array of individually controllable elements, according to one embodiment of the present invention. As shown, the actuator system is connected to the support plate 20 of the array of individually controllable elements at three points 41, 42, 43 on the opposite side of the support plate 20 to the active element (which for clarity is not shown in FIG. 5). In one example, the array of individually controllable elements is connected at three points to the supports for mounting the array of individually controllable elements to the support frame or the actuator system. This can be done to provide a statically determined system for mounting the array of individually controllable elements.

As discussed above, the array of individually controllable elements can be mounted to the lithographic apparatus such that the transfer of vibrations from the remainder of the lithographic apparatus to the array of individually controllable elements is minimized. This ensures that the accuracy of the position of the array of individually controllable elements relative to other components within the lithographic apparatus, such as the projection system, is as high as possible.

In one example, reduction in vibrations can be done to minimize so-called Micro-Overlay errors. Such errors can result because the pattern generated at a given portion on the substrate can be built up from two or more exposures. The Micro-Overlay errors are caused by one exposure on a given portion of the substrate being slightly displaced relative to its intended position relative to an earlier exposure. It is to be appreciated that a series of exposures can intentionally be displaced relative to each other on a larger scale, for example, by an amount equal to half the size of the exposure field. Such Micro-Overlay errors can be caused by vibrations within the lithographic apparatus, such as vibrations of the array of individually controllable elements. Accordingly, minimizing the transfer of vibrations to the array of individually controllable elements as discussed above, can also help minimize the Micro-Overlay errors. The Micro-Overlay errors can be especially caused by vibrations in a particular range of frequencies. Accordingly, the support of the array of individually controllable elements can be configured to minimize the transfer of vibrations within that frequency range.

In one example, Micro-Overlay errors can be further reduced by using an actuator system, such as discussed above to counter any movement that can produce Micro-Overlay errors. It should be appreciated that if the actuator system associated with the or each array of individually controllable elements is purely to be used to minimize Micro-Overlay errors, the actuator system may not need to control the position of the array of individually controllable elements in six degrees of freedom. For example, it can be sufficient to adjust the position of the array of individually controllable elements in two orthogonal linear directions within the plane of the patterning surface of the array of individually controllable elements. In general, the actuator system can be configured to provide position control in any number of degrees or freedom necessary for its intended use.

With reference again to FIG. 5, the arrangement of the three mounting points 41, 42, 43 of the array of individually controllable elements can be seen as a 'thermal center' 44 of the array of individually controllable elements. The thermal center 44 is the point of the body that remains at the same position in space when the body receives an increase in temperature. The support of the array of individually controllable elements can be specifically arranged in order to locate the thermal center 44 in a desired position, such that any thermal expansion of the arrays of individually controllable elements in the lithographic apparatus has the least impact on the quality of the image produced.

In one example, the actuator system is a hexapod arrangement. This is because the actuator system has three pairs 51, 52, 53 of linearly acting actuators. Actuator pair 51 includes actuators 54 and 55. Actuators 54 and 55 are arranged such that first ends of the actuators 54 and 55 are connected to the same point 41. Second ends of the actuators 54 and 55 are connected to points 56, 57 that are set apart from each other. Actuator pairs 52 and 53 are similarly configured.

In one example, the pairs of actuators can be arranged such that the commonly connected end of the actuators is connected to the array of individually controllable elements and the set apart ends of the pairs of actuators are connected to the support frame 20. It will be appreciated, however, that the actuator pairs can be connected the other way round. In order for the hexapod arrangement to be able to control the position of the array of individually controllable elements in six degrees of freedom, the points to which the commonly connected ends of the pairs of the linearly acting actuators are connected are closer together than the midpoints for each of the pairs of actuators between the points at which the actuators are connected at the ends that are connected set apart from each other.

In one example, the linearly acting actuators can be formed from piezo-electric actuators. The expected range of movement for the linearly acting actuators is relatively small, making piezo-electric actuators suitable, especially since such actuators permit highly accurate actuation. In one example, the linearly acting actuators are connected to the array of individually controllable elements and the support frame, such that the actuators are individually free to rotate relative to the array of individually controllable elements and the support frame. It should be noted that where the array of individually controllable elements is mounted to the support frame without an actuator system, the supports should also be mounted to the array of individually controllable elements and the support structure, such that they can rotate relative to the array of individually controllable elements and the support frame.

Figure 8A:
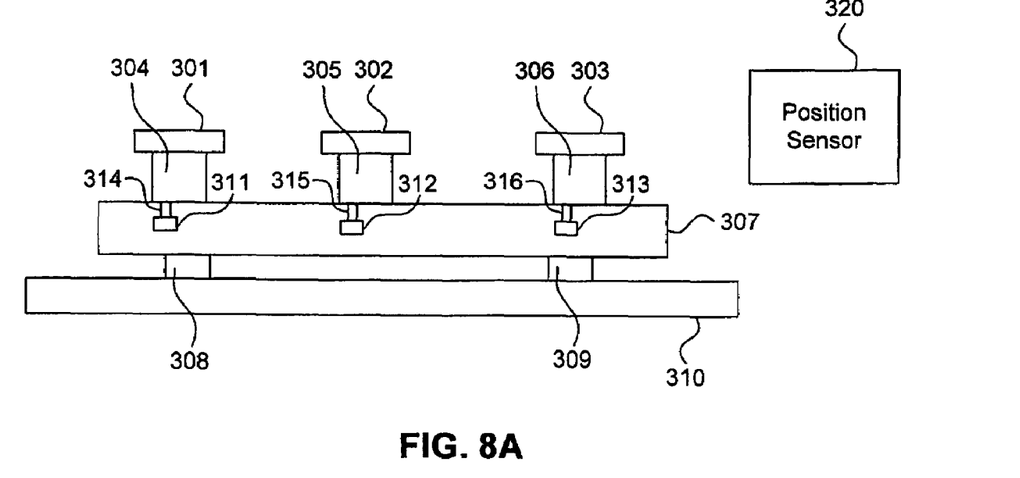
FIGS. 8a and 8b illustrate an arrangement including a balance mass system, according to one embodiment of the present invention.
Figure 8B:
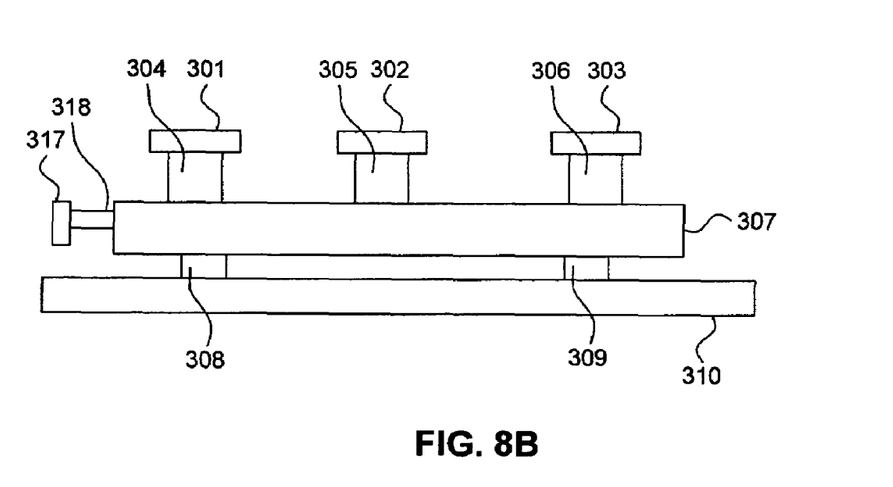

FIGS. 8a and 8b illustrate arrangements including balance mass systems, according to various embodiments of the present invention. The balance mass can be used to further minimize errors, such as Micro-Overlay errors, caused by the vibration of components within the lithographic apparatus. Although FIGS. 8a and 8b depict situations having three arrays of individually controllable elements, it will be appreciated that corresponding arrangements can be applied to lithographic apparatus having any number of arrays of individually controllable elements.

In the embodiment shown in FIG. 8a, three arrays of individually controllable elements 301, 302, 303 are mounted to a support frame 307 by means of respective actuator systems 304, 305, 306. The support frame 307 is, in turn, mounted to the base frame 310 of the lithographic apparatus by means of supports 308, 309. In order to compensate for the reaction forces applied to the support frame 307 by the actuator systems 304, 305, 306 when adjusting the positions of the arrays of individually controllable elements 301, 302, 303, respective balance masses 311, 312, 313 and associated balance mass actuators 314, 315, 316 are provided for each actuator system 304, 305, 306. Each balance mass and balance mass actuator are configured to provide to the support frame 307 a force that is equal and opposite to the reaction force provided to the support frame 307 by the associated actuator system. Accordingly, no net force is provided to the support frame in adjusting the position of each of the arrays of individually controllable elements 301, 302, 303, thereby minimizing the transfer of vibrations through the support frame 307 to the remainder of the lithographic apparatus, for example by means of the base frame 310. A position sensor 320 (also referred to as a position sensor system 320) is also shown that measures the position of each of the arrays of individually controllable elements relative to the support frame. Position Sensor 320 also measures the position of each of the arrays of individually controllable elements relative to the common reference frame. Further, position sensor 320 measures a position of a first one of the array of individually controllable elements relative to at least a second one of a first and second arrays of individually controllable elements within the apparatus.

In one example, control of the balance mass actuators 314, 315, 316 can be simply provided. This is because there is a direct correlation between the forces to be provided by the actuator system, and hence the control signals for the actuator system, and the forces to be provided by the balance mass system, and hence the control signals to be supplied to the balance mass actuator.

Turing now to the embodiment shown in FIG. 8b, the reaction forces generated by two or more of the actuator systems can be compensated for by means of a single balance mass system. This is in contrast to the embodiment shown in FIG. 8a, in which each actuator system for controlling the position of an array of individually controllable elements has an associated balance mass system comprising a balance mass and balance mass actuator.

With reference to FIG. 8*b*, the reaction forces generated by actuator systems 304, 305, 306 are compensated for by means of a balance mass 317 and associated balance mass actuator 318.

In one example, for the full benefit of the balance mass, the balance mass is controlled in as many degrees freedom as the actuator system.

In order for the position of the array of individually controllable elements to be accurately controlled, it is beneficial to be able to measure the position of the array of individually controllable elements, e.g., to provide feedback. Accordingly, in one example a position sensor system (not shown) is provided. The position sensor system can measure the position of the array of individually controllable elements relative to the support frame, to which the array of individually controllable elements is mounted. It can alternatively or additionally measure the position of individually controllable elements relative to a reference frame, which is also used for measuring the position of other components in the lithographic apparatus, such as the illumination system, the projection system and/or the substrate table or substrate itself. Furthermore, the position sensor system can alternatively or additionally measure the position of the array of individually controllable elements relative to another array of individually controllable elements.

In one example, the position sensor system can comprise a system of interferometers. Alternatively, a system can be used comprising a plurality of proximity sensors, such as capacitive or inductive sensors. Such sensors are configured to determine the separation between two parts of the sensor by measuring changes in capacitance or mutual inductance. By connecting the two parts of the proximity sensor to two parts of the lithographic apparatus, such as two arrays of individually controllable elements, it is possible to monitor the separation of the two components.

Figure 6A:
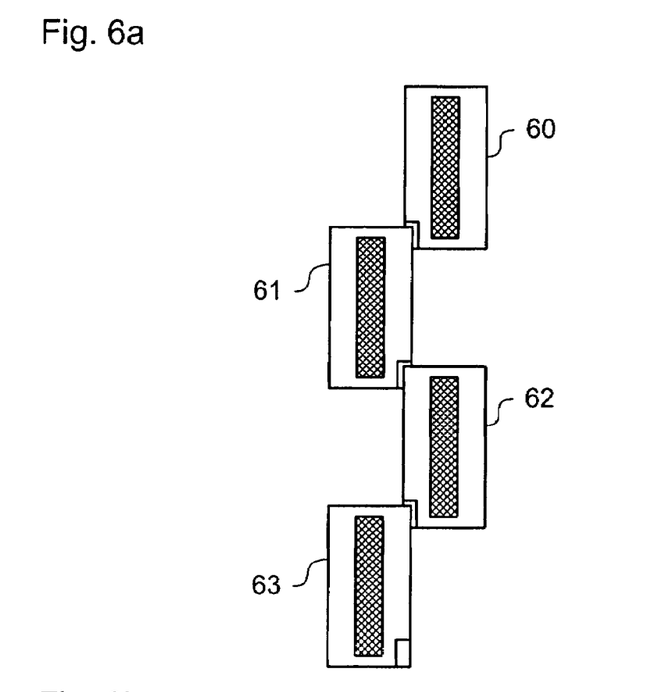
FIG. 6a depicts a layout for a plurality of arrays of individually controllable elements, according to one embodiment of the present invention.
Figure 6B:
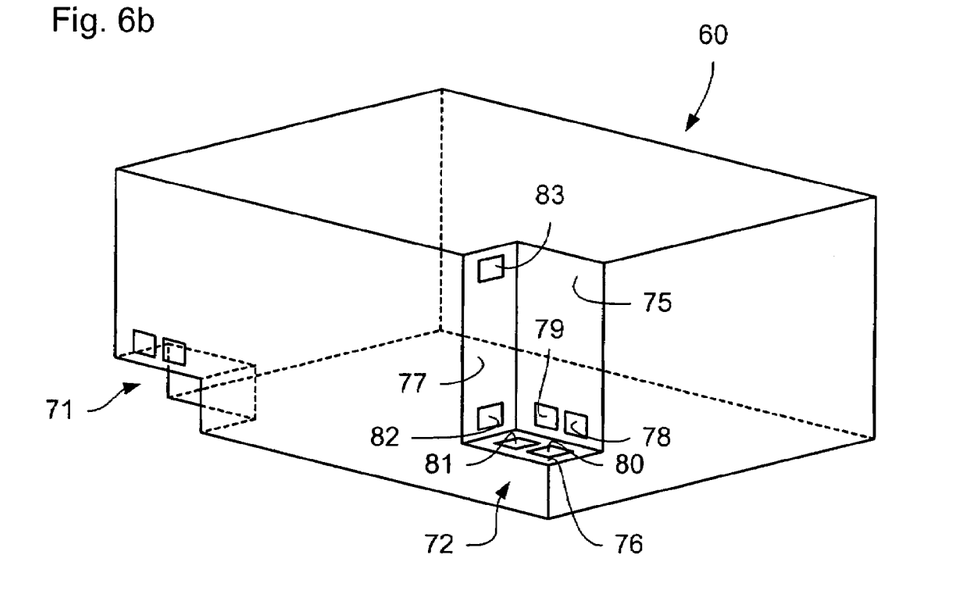
FIG. 6b depicts an array of individually controllable elements for use in an arrangement as shown in FIG. 6a, according to one embodiment of the present invention.

FIG. 6*a* depicts a layout for a plurality of arrays of individually controllable elements, according to one embodiment of the present invention. FIG. 6*b* depicts an array of individually controllable elements for use in an arrangement as shown in FIG. 6*a*, according to one embodiment of the present invention.

As shown in FIG. 6A, the arrangement of the arrays of individually controllable elements is similar to that shown in FIG. 3 and described above. However, as shown, a portion of the support part of each of the arrays of individually controllable elements (e.g., part of the passive area) overlaps with a portion of the support area of the adjacent array of individually controllable elements. For example, in the arrangement shown in FIG. 6A, a first row of arrays of individually controllable elements includes two arrays of individually controllable elements 61, 63 and a second row of arrays of individually controllable elements includes two arrays of individually controllable elements 60, 62. It will be appreciated that in practice, each row can include a larger number of arrays of individually controllable elements. One of the arrays of individually controllable elements 61 in the first row overlaps at one end with one of the arrays of individually controllable elements 60 in the second row and at the other end with the other of the arrays of individually controllable elements 62 in the second row.

FIG. 6B depicts one of the arrays of elements 60 from the second row. As shown, at a first end, the support plate of the array of individually controllable elements has a cut away portion 71 and, at the other end, the array of individually controllable elements has an extending portion 72. When the arrays of individually controllable elements are coupled to the support structure, the cut away portion of one of the arrays of individually controllable elements is arranged adjacent to the overlapped portion of the adjacent array of individually controllable elements, such that the arrays of individually controllable elements fit together. As a consequence of this arrangement, at the point at which two arrays of individually controllable elements are adjacent, each of the arrays of individually controllable elements has three mutually orthogonal faces 75, 76, 77 that are adjacent to and substantially parallel to three correspondingly mutually orthogonal faces on the adjacent array of individually controllable elements.

In one example, a capacitive sensor can be arranged having a first part on one face of a first array of individually controllable elements and a second part on the corresponding, substantially parallel, face on a second array of individually controllable elements, arranged adjacent to the first array of individually controllable elements. Accordingly, it is therefore possible to determine the separation between the two faces (and hence between the two arrays of individually controllable elements) in a direction perpendicular to the two faces. By providing such proximity sensors on each of the three pairs of adjacent faces, it is possible to determine the separation of the two arrays of individually controllable elements along three orthogonal directions.

In one example, as shown in FIG. 6B, each of the orthogonal surfaces 75, 76, 77 on each of the arrays of individually controllable elements can be provided with two proximity sensors 78, 79, 80, 81, 82, 83, respectively. The use of two proximity sensors per face enables the determination of the relative angles of the two corresponding faces on the two arrays of individually controllable elements (and hence the relative orientation of the two arrays of individually controllable elements). Accordingly, by arranging the arrays of individually controllable elements, for example similarly to as shown in FIGS. 6A and 6B, such that each array of individually controllable elements has three mutually orthogonal faces substantially parallel to corresponding faces on the adjacent array of individually controllable elements and each of these pairs of substantially parallel faces is provided with two proximity sensors, it is possible to determine the position of one array of individually controllable elements relative to an adjacent array of individually controllable elements in six degrees of freedom.

Figure 7A:
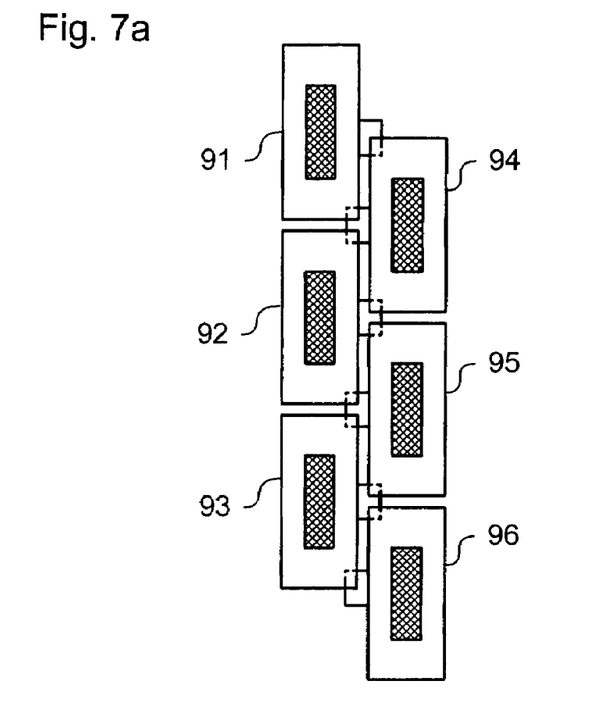
FIG. 7a shows a layout for a plurality of arrays of individually controllable elements, according to one embodiment of the present invention.
Figure 7B:
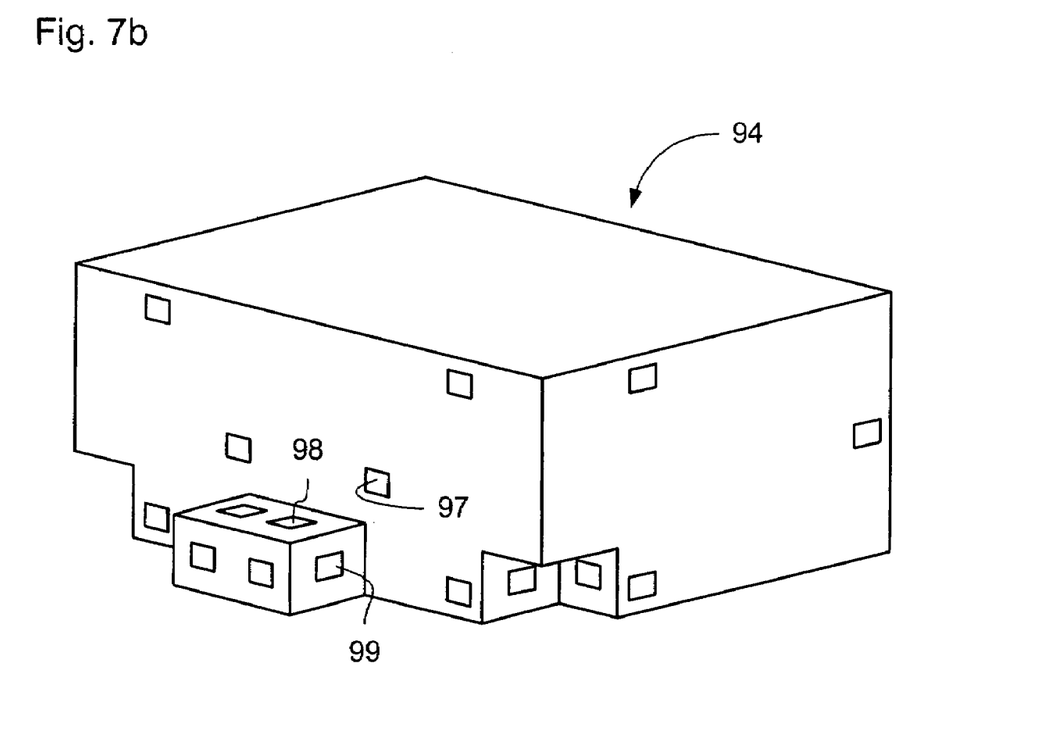
FIG. 7b shows an array of individually controllable elements for use in the arrangement shown in FIG. 7a, according to one embodiment of the present invention.

FIG. 7*a* shows a layout for a plurality of arrays of individually controllable elements, according to one embodiment of the present invention. FIG. 7*b* shows an array of individually controllable elements for use in the arrangement shown in FIG. 7*a*, according to one embodiment of the present invention. FIGS. 7A and 7B depict an alternative arrangement to that shown in FIGS. 6A and 6B. In the arrangement shown in FIGS. 7A and 7B, the lithographic apparatus includes a first row of arrays of individually controllable elements 91, 92, 93 and a second row of arrays of individually controllable elements 94, 95, 96. In this arrangement, each array of individually controllable elements is adjacent to, and has proximity sensors to determine the separation from, two arrays of individually controllable elements in the adjacent row as well as the arrays of individually controllable elements on either side within its own row. It should be appreciated that this does not apply to the arrays of the individually controllable elements at the ends of the rows. For example, an array of individually controllable elements 92 in the first row is adjacent to two arrays of individually controllable elements 94, 95 in the second row and the arrays of individually controllable elements 91, 93 on either side of it within the first row. As shown in FIG. 7B, a plurality of proximity sensors 97, 98, 99 are provided on each array of individually controllable elements in order to determine its position relative to each of the adjacent arrays of individually controllable elements.

In one example, it may not be necessary to provide between each adjacent pair of arrays of individually controllable elements three orthogonal surfaces for determining the relative position of the two arrays of individually controllable elements. This is because the relative position of two adjacent arrays of individually controllable elements can be determined, at least in part, from proximity determinations between each of the arrays of individually controllable elements and a third array of individually controllable elements adjacent to both of the first arrays of individually controllable elements. It should be appreciated, however, that it can also be desirable to have a greater number of proximity sensors than the minimum number required in order to provide redundancy. Such redundancy can be useful because the proximity sensors have a limited range. Therefore, if the movement of one array of individually controllable elements relative to another becomes too large the measurements from one of the proximity sensors may not be reliable. However the measurements from another proximity sensor can be.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
a support frame having a mounting point;
first and second rows each including arrays of individually controllable elements configured to be used to modulate respective corresponding portions of a beam of radiation; and
a position sensor configured to measure a position of a first one of the arrays of individually controllable elements relative to at least a second one of the arrays of individually controllable elements of at least the first row within the apparatus.

2. The apparatus of claim 1, further comprising:
an actuator system that is associated with each of the arrays of individually controllable elements and that controls the position of each of the arrays of individually controllable elements relative to the support frame.

3. The apparatus of claim 2, wherein the actuator system controls the position of each of the arrays of individually controllable elements in six degrees of freedom.

4. The apparatus of claim 2, wherein each of the arrays of individually controllable elements is mounted to the mounting point through use of the associated actuator system, such that the actuator supports each of the arrays of individually controllable elements in addition to controlling their position.

5. The apparatus of claim 2, further comprising:
an illumination system that produces the beam of radiation that is modulated by the arrays of individually controllable elements;
a projection system that projects the modulated beam onto a target portion of a substrate;
a memory containing data representing a telecentricity error of an image formed on the substrate introduced by at least one of the illumination system and the projection system; and
a controller that controls the actuator system to set the position of the array of individually controllable elements such that an overall telecentricity error of the image projected onto the substrate is minimized.

6. The apparatus of claim 2, wherein the actuator system is attached to each of the arrays of individually controllable elements to form an integral unit that is replaceably attached to the mounting point.

7. The apparatus of claim 6, wherein the actuator system comprises:
three pairs of linearly acting actuators,
wherein each of the actuators is connected at one end to the support frame and at an other end to a support side of each of the arrays of individually controllable elements on an opposite side of each of the arrays of individually controllable elements than an active side for patterning a beam of radiation,
wherein the pairs of actuators are arranged such that on one of the support frame and the support side of each of the arrays of individually controllable elements both actuators of each pair are connected at the same point,
wherein on the other end of the support frame and the support side of each of the arrays of individually controllable elements the actuators of each pair are connected set apart from each other, and
wherein the separation of the mid point between set apart ends of the actuators of each pair is greater than the separation of connected ends of the pairs of actuators.

8. The apparatus of claim 7, wherein the linearly acting actuators are connected to each of the arrays of individually controllable elements and the support frame, such that the linearly acting actuators rotate relative to the corresponding arrays of individually controllable elements and the support frame, respectively.

9. The apparatus of claim 2, further comprising:
a balance mass; and
an associated balance mass actuator,
wherein the balance mass and the associated balance mass actuator provide to the support frame a force that is equal and opposite to the force applied to the support frame by the actuator system.

10. The apparatus of claim 9, wherein the balance mass and balance mass actuator apply force directly to the support frame.

11. The apparatus of claim 9, further comprising:
additional ones of the arrays of individually controllable elements and associated actuator systems,
wherein the balance mass and associated balance mass actuator provide to the support frame a force that is equal and opposite to the sum of the forces applied to the support frame by two or more of the actuator systems.

12. The apparatus of claim 1, further comprising:
a controller that controls each of the arrays of individually controllable elements; and
a flexible cable that individually connects the arrays of individually controllable elements to the controller to provide control signals.

13. The apparatus of claim 12, wherein the flexible cable is detachably attached to at least one of the controller and the arrays of individually controllable elements.

14. The apparatus of claim 12, wherein the controller is mounted on the support frame immediately adjacent to the mounting point of at least one of the arrays of individually controllable elements.

15. The apparatus of claim 1, wherein each of the arrays of individually controllable elements is comprised of:
   a planar plate;
   an active device containing the individually controllable elements bonded onto one surface of the planar plate; and
   at least one connection point used to mount at least one of the arrays of individually controllable elements on the opposite surface of the planar plate to the surface on which the active device is bonded.

16. The apparatus of claim 15, further comprising:
   a cooling element thermally connected to the planar plate of at least one of the arrays of individually controllable elements to form an integral unit that is replaceably attached to the mounting point.

17. The apparatus of claim 15, wherein the planar plate has a fluid conduit within it, and the lithographic apparatus further comprises:
   a fluid cooling unit connected to the fluid conduit.

18. The apparatus of claim 17, further comprising:
   a flexible fluid conduit that connects the fluid conduit within each of the arrays of individually controllable elements to the fluid cooling unit.

19. The apparatus of claim 1, further comprising:
   a common reference frame,
   wherein the position sensor system measures a position of each of the rows of individually controllable elements relative to the common reference frame, and wherein the position of at least one other component in the lithographic apparatus is measured relative to the common reference frame.

20. The apparatus of claim 1, wherein the position sensor system comprises:
   at least one proximity sensor having a first part on the first one of the arrays of individual controllable elements and a second part on the second one of the arrays of individually controllable elements.

21. The apparatus of claim 1, wherein:
   the first row of individually controllable elements has three mutually non-parallel faces substantially parallel to and adjacent to three corresponding faces on the second array of individually controllable elements; the position sensor includes a proximity sensor associated with each of the three pairs of corresponding faces, each of the proximity sensors having a first part on one of the faces on the first one of the arrays of individually controllable elements and a second part on the corresponding face on the second one of the arrays of individually controllable elements.

22. The apparatus of claim 21, wherein the sensor system comprises:
   two proximity sensors associated with each of the three pairs of corresponding faces.

23. The apparatus of claim 22, wherein the sensor system comprises:
   additional proximity sensors, each of the additional proximity sensors having a first part on a face of the first one of the arrays of individually controllable elements and a second part on a substantially parallel, adjacent face on the second one of the arrays of individually controllable elements.

24. The apparatus of claim 1, further comprising:
   an illumination system configured to condition the beam of radiation, which is modulated by the arrays of individually controllable elements; and
   a projection system configured to project the modulated beam of radiation onto a portion of the substrate,
   wherein at least one of illumination system, the projection system, and the substrate is wholly or partly mounted to the support frame.

25. A lithographic apparatus, comprising:
   a support frame having a mounting point;
   a row including an array of individually controllable elements configured to be used to modulate a beam of radiation;
   an actuator system that is associated with the array of individually controllable elements and that is configured to control the position of the array of individually controllable elements relative to the support frame;
   a balance mass; and
   an associated balance mass actuator,
   wherein the balance mass and the associated balance mass actuator provide to the support frame a force that is equal and opposite to the force applied to the support frame by the actuator system.

26. The apparatus of claim 25, wherein the actuator system controls the position of the array of individually controllable elements in six degrees of freedom.

27. The apparatus of claim 25, wherein the array of individually controllable elements is mounted to the mounting point through use of the associated actuator system, such that the actuator supports the array of individually controllable elements in addition to controlling its position.

28. The apparatus of claim 25, wherein the actuator system is attached to the array of individually controllable elements to form an integral unit that is replaceably coupled to the mounting point.

29. The apparatus of claim 28, wherein the actuator system comprises:
   three pairs of linearly acting actuators,
   wherein each of the actuators is connected at one end to the support frame and at an other end to a support side of the array of individually controllable elements on an opposite side of the array of individually controllable elements than an active side for patterning a beam of radiation, wherein the pairs of actuators are arranged such that on one of the support frame and the support side of the array of individually controllable elements both actuators of each pair are connected at the same point,
   wherein on the other end of the support frame and the support side of the array of individually controllable elements the actuators of each pair are connected set apart from each other, and
   wherein the separation of the mid point between set apart ends of the actuators of each pair is greater than the separation of connected ends of the pairs of actuators.

30. The apparatus of claim 29, wherein the linearly acting actuators are connected to the array of individually controllable elements and the support frame, such that the linearly acting actuators rotate relative to the array of individually controllable elements and the support frame, respectively.

31. The apparatus of claim 25, wherein the balance mass and balance mass actuator apply force directly to the support frame.

32. The apparatus of claim 25, further comprising:
a plurality of the array of individually controllable elements and associated actuator systems,
wherein the balance mass and associated balance mass actuator provide to the support frame a force that is equal and opposite to the sum of the forces applied to the support frame by two or more of the actuator systems.

33. The apparatus of claim 25, further comprising:
an illumination system that produces the beam of radiation that is modulated by the array of individually controllable elements;
a projection system that projects the modulated beam onto a target portion of a substrate;
a memory containing data representing a telecentricity error of an image formed on the substrate introduced by at least one of the illumination system and the projection system; and
a controller that controls the actuator system to set the position of the array of individually controllable elements such that an overall telecentricity error of the image projected onto the substrate is minimized.

34. A lithographic apparatus, comprising:
a support frame having a plurality of mounting points;
a plurality of rows each including arrays of individually controllable elements;
a common reference frame; and
a position sensor configured to measure a position of each of the plurality of arrays of individually controllable elements relative to the common reference frame,
wherein the position of at least one other component in the lithographic apparatus is measured relative to the common reference frame, and
wherein the position sensor measures a position of a first one of the plurality of the arrays of individually controllable elements relative to at least a second one of the plurality of the arrays of individually controllable elements within the apparatus.

35. The apparatus of claim 34, wherein the position sensor system comprises:
at least one proximity sensor having a first part on the first one of the plurality of the arrays of individual controllable elements and a second part on the second one of the plurality of the arrays of individually controllable elements.

36. The apparatus of claim 34, wherein:
the first one of the plurality of arrays of individually controllable elements has three mutually non-parallel faces substantially parallel to and adjacent to three corresponding faces on the second one of the plurality of arrays of individually controllable elements, the sensor system includes a proximity sensor associated with each of the three pairs of corresponding faces, and each of the proximity sensors having a first part on one of the faces on the first one of the plurality of the arrays of individually controllable elements and a second part on the corresponding face on the second one of the plurality of the arrays of individually controllable elements.

37. The apparatus of claim 36, wherein the sensor system comprises:
two proximity sensors associated with each of the three pairs of corresponding faces.

38. The apparatus of claim 37, wherein the sensor system comprises:
additional proximity sensors, each of the additional proximity sensors having a first part on a face of the first one of the plurality of the arrays of individually controllable elements and a second part on a substantially parallel, adjacent face on the second one of the plurality of the arrays of individually controllable elements.

* * * * *